US006806531B1

United States Patent
Chen et al.

(10) Patent No.: US 6,806,531 B1
(45) Date of Patent: Oct. 19, 2004

(54) NON-VOLATILE FLOATING GATE MEMORY CELL WITH FLOATING GATES FORMED IN CAVITIES, AND ARRAY THEREOF, AND METHOD OF FORMATION

(75) Inventors: Bomy Chen, Cupertino, CA (US); Dana Lee, Santa Clara, CA (US); Bing Yeh, Los Altos Hills, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 0 days.

(21) Appl. No.: 10/409,248

(22) Filed: Apr. 7, 2003

(51) Int. Cl.$^7$ .............................................. H01L 29/788
(52) U.S. Cl. ........................ 257/317; 257/315; 257/316
(58) Field of Search ................................. 257/315, 316, 257/317

(56) References Cited

U.S. PATENT DOCUMENTS

| | | | |
|---|---|---|---|
| 5,021,999 A | * 6/1991 | Kohda et al. | 365/185.03 |
| 5,029,130 A | 7/1991 | Yeh | |
| 6,011,725 A | 1/2000 | Eitan | |
| 6,093,945 A | * 7/2000 | Yang | 257/317 |
| 6,281,545 B1 | * 8/2001 | Liang et al. | 257/315 |
| 6,597,036 B1 | * 7/2003 | Lee et al. | 257/316 |
| 2002/0056870 A1 | * 5/2002 | Lee et al. | 257/314 |
| 2002/0163031 A1 | * 11/2002 | Liu et al. | 257/315 |

OTHER PUBLICATIONS

IEEE, 2002, entitled "Quantum–well Memory Device (QW/MD) With Extremely Good Charge Retention," Z. Krivokapic, et al. (4 pages).

* cited by examiner

Primary Examiner—Ngân V. Ngô
(74) Attorney, Agent, or Firm—Gray Cary Ware & Freidenrich LLP

(57) ABSTRACT

A non-volatile memory cell has a single crystalline semiconductive material, such as single crystalline silicon, of a first conductivity type. A first and a second region each of a second conductivity type, different from the first conductivity type, spaced apart from one another is formed in the semiconductive material. A channel region, having a first portion, and a second portion, connects the first and second regions for the conduction of charges. A dielectric is on the channel region. A floating gate, which can be conductive or non-conductive, is on the dielectric, spaced apart from the first portion of the channel region. The first portion of the channel region is adjacent to the first region, with the first floating gate having generally a triangular shape. The floating gate is formed in a cavity. A gate electrode is capacitively coupled to the first floating gate, and is spaced apart from the second portion of the channel region. The second portion of the channel region is between the first portion and the second region. A bi-directional non-volatile memory cell has two floating gates each formed in a cavity. A method of making the non-volatile memory cell and the array are also disclosed.

24 Claims, 7 Drawing Sheets

NON-VOLATILE FLOATING GATE MEMORY CELL WITH FLOATING GATES FORMED IN CAVITIES, AND ARRAY THEREOF, AND METHOD OF FORMATION

TECHNICAL FIELD

The present invention relates to a non-volatile memory cell, that uses a floating gate formed in a cavity for the storage of charges. More particularly, the present invention relates to such a non-volatile memory cell in which two floating gates are formed, and is capable of bi-directionally storing and reading a plurality of bits in a single cell and an array of such cells, and a method of manufacturing.

BACKGROUND OF THE INVENTION

Uni-directional read/program non-volatile memory cells using floating gate for storage are well known in the art. See for example, U.S. Pat. No. 5,029,130. Typically, each of these types of memory cells uses a conductive floating gate to store one bit, i.e. either the floating gate stores charges or it does not. The charges stored on a floating gate control the conduction of charges in a channel of a transistor. In a desire to increase the storage capacity of such non-volatile memory cells, the floating gate of such memory cell is programmed to store some charges, with the different amount of charges stored being determinative of the different states of the cell, thereby causing a plurality of bits to be stored in a single cell. The problem with programming a cell to one of a multilevel state and then reading such a state is that the amount of charge stored on the floating gate differentiating one state from another must be very carefully controlled. Further, in the unidirectional read/program non-volatile memory cell of the prior art, the floating gate has been made by a lithographic process involving masking steps and the like, resulting in a "large" structure.

In an article entitled "Quantum-well Memory Device (QWMD) with Extremely Good Charge Retention" by Z. Krivokapic et al., published by IEEE in 2002, the authors described a device using floating gates as quantum wells. This however, is very different from a non-volatile memory cell with spaced apart regions and a channel therebetween for the conduction of charges.

Bi-directional read/program non-volatile memory cells capable of storing a plurality of bits in a single cell are also well known in the art. See, for example, U.S. Pat. No. 6,011,725. Typically, these types of memory cells use an insulating trapping material, such as silicon nitride, which is between two other insulation layers, such as silicon dioxide, to trap charges. The charges are trapped near the source/drain also to control the conduction of charges in a channel of a transistor. The cell is read in one direction to determine the state of charges trapped near one of the source/drain regions, and is read in the opposite direction to determine the state of charges trapped near the other source/drain region. Hence, these cells are read and programmed bi-directionally. The problem with these types of cells is that to erase, holes or charges of the opposite conductivity must also be "programmed" or injected into the trapping material at precisely the same location where the programming charges were initially trapped in order to "neutralize" the programming charges. Since the programming charges and the erase charges are injected into a non-conductive trapping material, the charges do not move as in a conductive material. Therefore, if there is any error in injecting the erase charges to the location of the programming charges, the erase charges will not neutralize the programming charges, and the cell will not be completely erased. Moreover, to inject the erase charges, the cell must be erased bi-directionally, thereby increasing the time required for erasure of one cell.

Hence there is a need for a non-volatile memory cell and array that overcomes these problems.

SUMMARY OF THE INVENTION

In the present invention, a non-volatile memory cell comprises a substantially single crystalline semiconductive material, such as single crystalline silicon, of a first conductivity type. A first and a second region each of a second conductivity type, different from the first conductivity type, spaced apart from one another is formed in the semiconductive material. A channel region, having a first portion, and a second portion, connects the first and second regions for the conduction of charges. A dielectric is on the channel region. A floating gate is on the dielectric, spaced apart from the first portion of the channel region. The first portion of the channel region is adjacent to the first region, with the floating gate having generally a triangular shape. A gate electrode is capacitively coupled to the floating gate, and is spaced apart from the second portion of the channel region. The second portion of the channel region is between the first portion and the second region.

The present invention also relates to a bi-directional read/program non-volatile memory cell having two floating gates, each having a generally triangular shape, and an array of the foregoing described non-volatile memory cells, and a method of making the non-volatile memory cell and the array.

DETAILED DESCRIPTION OF THE INVENTION

Figure 1A:
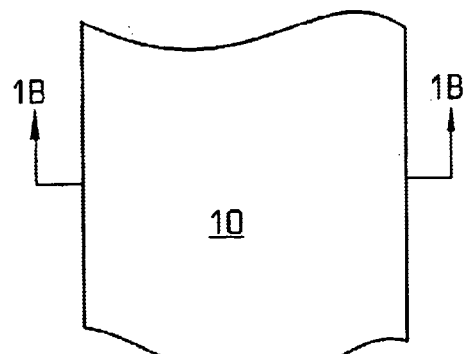
FIG. 1A is a top view of a semiconductor substrate used in the first step of the method of present invention to form isolation regions.
Figure 1B:
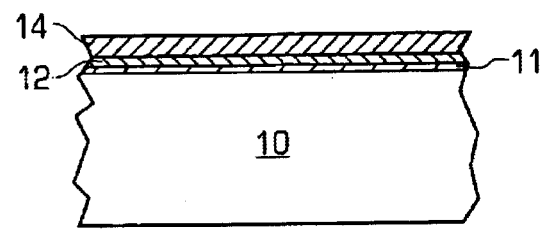
FIG. 1B is a cross sectional view of the structure taken along the line 1B—1B showing the initial processing steps of the present invention.
Figure 1C:
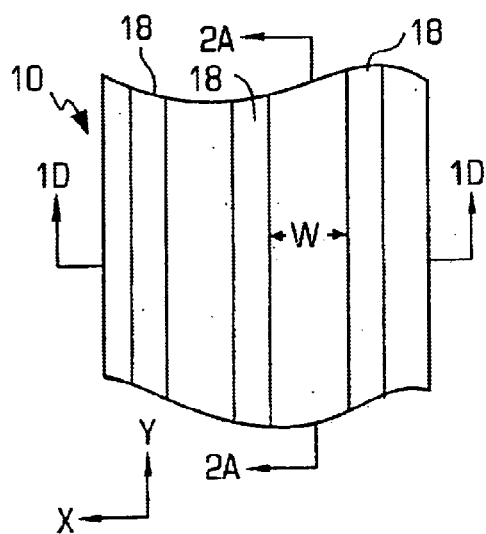
FIG. 1C is a top view of the structure showing the next step in the processing of the structure of FIG. 1B, in which isolation regions are defined.
Figure 1D:
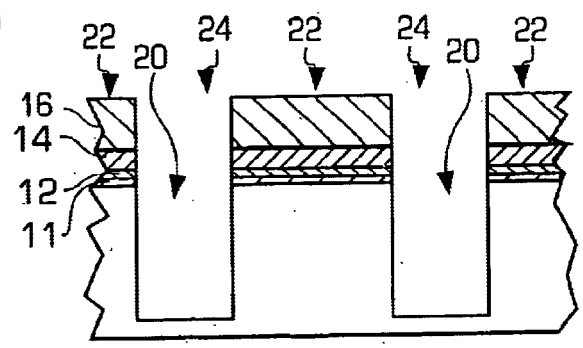
FIG. 1D is a cross sectional view of the structure in FIG. 1C taken along the line 1D—1D showing the isolation trenches formed in the structure.
Figure 1F:
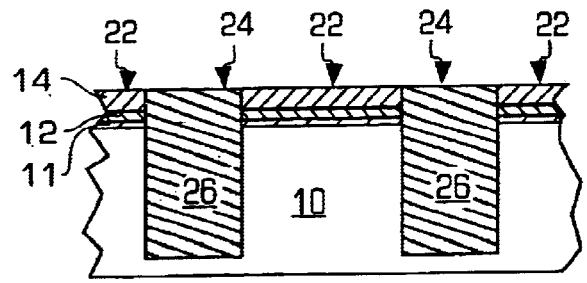
FIG. 1E is a cross sectional view of the structure in FIG. 1D showing the formation of isolation blocks of material in the isolation trenches.
Figure 2A:
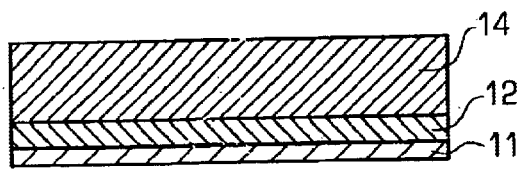
FIGS. 2A–2O are cross sectional views of the semiconductor structure in FIG. 1F taken along the line 2A—2A showing in sequence the steps in the processing of the semiconductor structure in the formation of the cell portion of a non-volatile memory array of floating gate memory cells of the present invention.
Figure 3A:
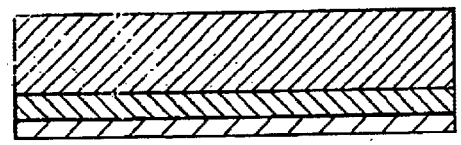
FIGS. 3A–3O are cross sectional views of the semiconductor structure in FIG. 1F taken along the line 2A—2A showing in sequence the steps in the processing of the semiconductor structure in the formation of the periphery portion of a non-volatile memory array of floating gate memory cells of the present invention.

The method of the present invention is illustrated in FIGS. 1A to 1E and 2A to 2O, which show the processing steps in making the memory cell array of the present invention, and FIGS. 3A to 3O which show the processing steps in making the peripheral portion of the memory cell array of the present invention. The method begins with a semiconductor substrate 10, which is preferably of P type and is well known in the art. The thickness of the layers described below will depend upon the design rules and the process technology generation. What is described herein is for the 0.10 micron process. However, it will be understood by those skilled in the art that the present invention is not limited to any specific process technology generation, nor to any specific value in any of the process parameters described hereinafter.

Isolation Region Formation

FIGS. 1A to 1E illustrate the well known STI method of forming isolation regions on a substrate. Referring to FIG. 1A there is shown a top plan view of a semiconductor substrate 10 (or a semiconductor well), which is preferably of P type and is well known in the art. A first layer 11 of silicon dioxide (hereinafter "oxide") is formed (e.g. grown or deposited) on the substrate 10 by any well known technique such as oxidation or oxide deposition (e.g. chemical vapor deposition or CVD) to a thickness of approximately 50–120 angstroms. A second layer of polysilicon 12 is formed (e.g. grown or deposited) on the oxide 11. As will be discussed in greater detail, hereinafter, the second layer of polysilicon 12 comprises three sublayers: a first sublayer of intrinsic polysilicon (having a thickness on the order of 100–500 angstroms), a second sublayer of doped polysilicon (doped with e.g. As, and having a thickness on the order of 30–50 angstroms) on the first sublayer of intrinsic polysilicon, and a third sublayer of intrinsic polysilicon (having a thickness on the order of 30–50 angstroms) on the layer of doped polysilicon. As will be seen, the second layer of polysilicon 12 is a sacrificial layer. Although it is described as being formed of polysilicon, it can be formed of any material, including but not limited to insulating material such as oxide or silicon nitride (hereinafter "nitride"). Finally, a third layer of nitride 14 is formed over polysilicon layer 12 preferably by CVD to a thickness of approximately 1000–2000 angstroms. FIG. 1B illustrates a cross-section of the resulting structure.

Once the first, second and third layers 11/12/14 have been formed, suitable photo resist material 16 is applied on the nitride layer 14 and a masking step is performed to selectively remove the photo resist material from certain regions (stripes 18) that extend in the Y or column direction, as shown in FIG. 1C. Where the photo-resist material 16 is removed, the exposed nitride layer 14, polysilicon layer 12, and oxide layer 11 are etched away in stripes 18 using standard etching techniques (i.e. anisotropic nitride, polysilicon, and oxide etch processes) to form trenches 20 in the structure. The distance W between adjacent stripes 18 can be as small as the smallest lithographic feature of the process used. A silicon etch process is then used to extend trenches 20 down into the silicon substrate 10 to a depth of approximately 500–4000 angstroms, as shown in FIG. 1D. Where the photo resist 16 is not removed, the nitride layer 14, polysilicon layer 12 and oxide layer 11 are maintained. The resulting structure illustrated in FIG. 1D now defines active regions 22 interlaced with isolation regions 24.

The structure is further processed to remove the remaining photo resist 16. Then, an isolation material such as silicon dioxide is formed in trenches 20 by depositing a thick oxide layer, followed by a Chemical-Mechanical-Polishing or CMP etch (using nitride layer 14 as an etch stop) to remove the oxide layer except for oxide blocks 26 in trenches 20, as shown in FIG. 1E.

FIGS. 1A to 1E illustrate the memory cell array region of the substrate, in which columns of memory cells will be formed in the active regions 22 which are separated by the isolation regions 24. It should be noted that the substrate 10 also includes at least one periphery region in which control circuitry is formed that will be used to operate the memory cells formed in the memory cell array region. Preferably, isolation blocks 26 are also formed in the periphery region during the same STI process described above.

Memory Cell Array Formation

The structure shown in FIG. 1E is further processed as follows. FIGS. 2A to 2O show the cross sections of the structure in the active regions 22 from a view orthogonal to that of FIG. 1E (along line 2A—2A as shown in FIG. 1C). FIG. 2A is a cross sectional view of the structure shown in FIG. 1E taken along the line 2A—2A in the memory cell array portion. FIG. 3A is a cross sectional view of the peripheral portion.

Figure 2B:
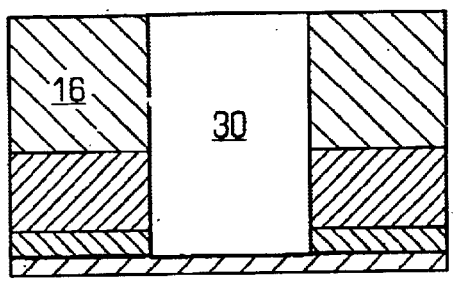
Figure 3B:
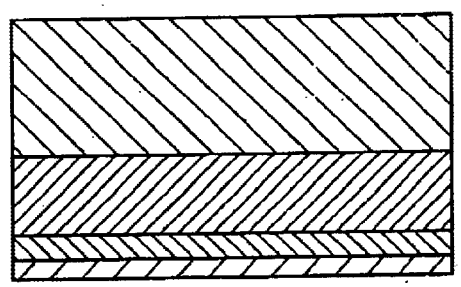

Photoresist 16 is then applied every where, including over the periphery portion. A masking step is performed wherein stripes extending in the X direction, of the photoreists 16 are removed. Openings 30 in the photoresist are made. With the photoresist as a mask, an anisotropic etch of the nitride 14 is then made, with polysilicon 12 used as an etch stop. This is followed by an anisotropic etch of the polysilicon 12 with the oxide 11 used as an etch stop. The resultant structure is shown in FIG. 2B. It should be noted that the opening 30 shown in FIG. 2B is not continuous in the X direction (i.e. in or out of the paper) since adjacent to the opening 30 is the STI oxide 26. The periphery portion, protected by the photoresist 16 will remain unaffected by this processes, as shown in FIG. 3B.

Figure 2C:
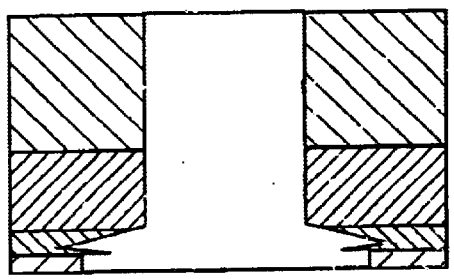
Figure 3C:
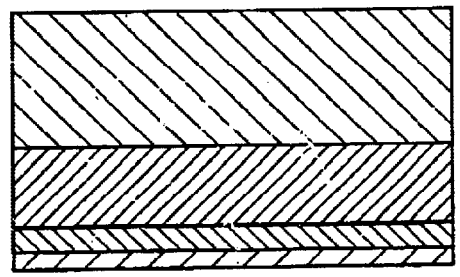

A wet etch of polysilicon 12 is then made. Because the periphery is still protected by the photoresist 16, there is no change due to the wet etch of the polysilicon. In the cell portion, the wet etch of polysilicon 12 causes "sideways" etching of the polysilicon 12, such that the doped polysilicon sublayer will etch faster than the undoped or intrinsic polysilicon sublayers. This is due to the difference in the etch rate between doped polysilicon and undoped or intrinsic polyslicon. Furthermore, this etching process is inherently self limiting in that the sideway length by which this process etches the polysilicon is limited by the diffusion rate of the etchant. A wet etching process of the oxide layer 11 is then made. The resultant structure is shown in FIG. 2C. The periphery portion remains unchanged as shown in FIG. 3C.

Figure 2D:
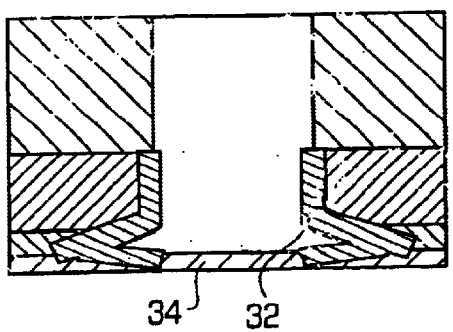
Figure 3D:
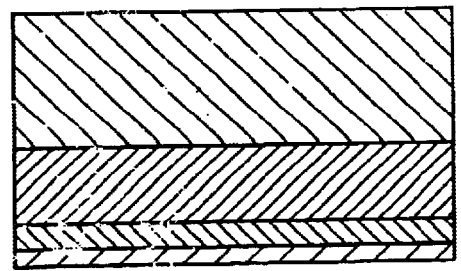

An oxidation process of the structure shown in FIG. 2C is carried out. This oxidizes the exposed polysilicon 12, forming layer 32. Further a layer of oxide 34 is deposited, preferably by HTO CVD process forming a layer of approximately 200–250 angstroms. The resultant structure is shown in FIG. 2D. The periphery portion remains unchanged as shown in FIG. 3D.

Figure 2E:
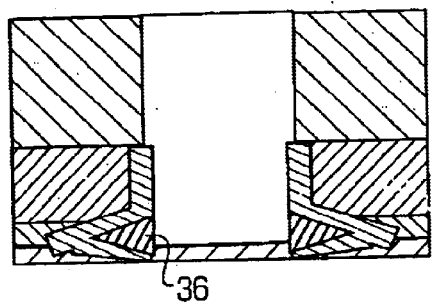
Figure 3E:
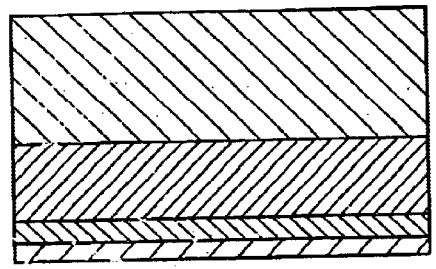

Doped polysilicon 36 is then deposited onto the structure by, e.g. CVD, to a thickness on the order of 100–250 angstroms. The polysilicon 36 fills the "cavities" from which the previous wet etch was made. This is then followed by an anisotropic etch, with the oxide layer 34 used as an etch stop. The resultant structure is shown in FIG. 2E. The periphery portion remains unaffected, as shown in FIG. 3E.

Alternatively, a material that can trap charges, such as nitride, instead of polysilicon, can be used to fill the "cavities" from which the wet etch was made. Using nitride will result in the memory cell operate similar to that disclosed in U.S. Pat. No. 6,011,725.

Figure 2F:
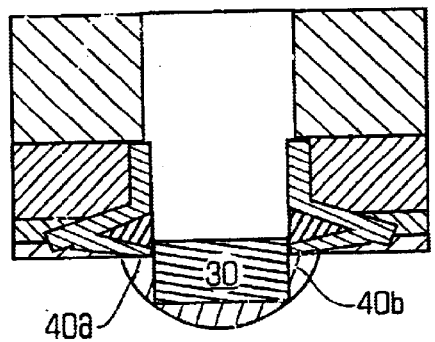
Figure 3F:
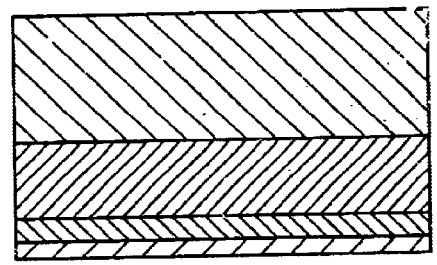

The layer 34 of oxide is then removed by anisotropic etch, exposing the underlying substrate 10. The removal of the oxide layer 34 also causes a portion of the oxide in the STI 26 to be removed. The substrate 10 is then anisotropically etched to a depth of approximately 500–4000 angstroms, which is the depth of the STI 26 in the substrate 10. An anisotropic etching of the oxide 26 in the STI is then performed, with the substrate 10 used as an etch stop. The result is a trench 30 that is continuous in the X direction, as shown in FIG. 2F. Further, an implant is made forming source/drain regions 40(a,b) that surround the trench 30. Thus, the source/drain 40(a,b) extend continuously in the X direction. In addition, the source/drain 40(a,b) form source/drain regions for the active devices to one side of the trench 30 and form the source/drain for the active devices on the other side of the trench 30. Thus, adjacent rows of devices share common source/drain regions. The resultant structure is shown in FIG. 2F. The periphery remains unchanged as shown in FIG. 3F.

Figure 2G:
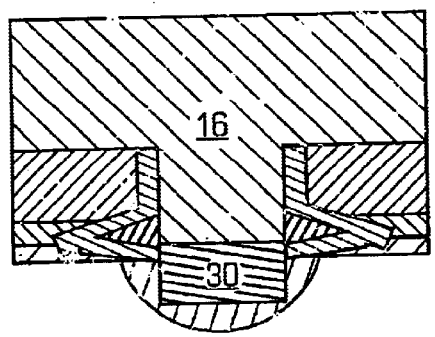
Figure 3G:
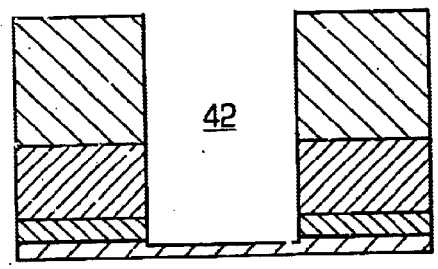

The photoresist layer 16 is removed, and then re-applied over the entire structure. Openings 42 are made in the periphery portion as shown in FIG. 3G. The cell portion protected by the photoresist 16 is unchanged, as shown in FIG. 2G. In the periphery portion, an anisotropic etch of the nitride layer 14 with the polysilicon layer 12 used as an etch stop. Thereafter the polysilicon layer 12 is anisotropically etched until the oxide layer 11 is reached. The resultant structure is shown in FIG. 3G.

Figure 2H:
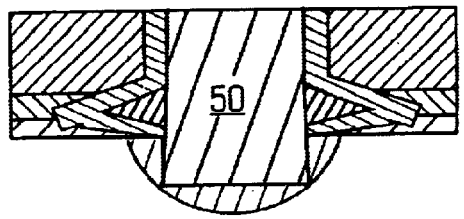
Figure 3H:
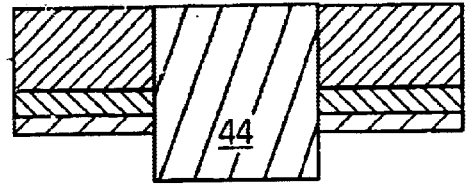

The exposed oxide layer 11 in the periphery region is anisotropically etched until the substrate 10 is reached. The substrate 10 is then etched in the periphery to form STI trenches 42. The photoresist 16 is then removed. STI oxide 44 is deposited in the trench 42, and STI oxide 50 is deposited in the trench 30. Conventional CMP process is used to polish the planar surface of the oxide in the STI 30 and 42 to be planar with the nitride layer 14. The resultant structure is shown in FIGS. 2H and 3H.

Figure 2I:
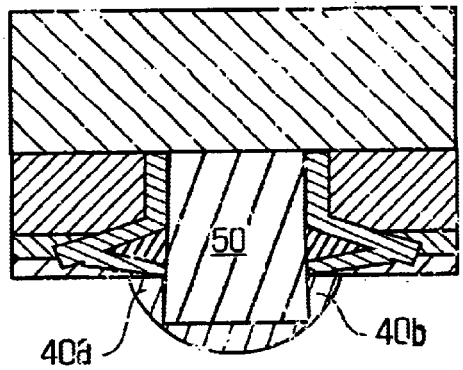
Figure 3I:
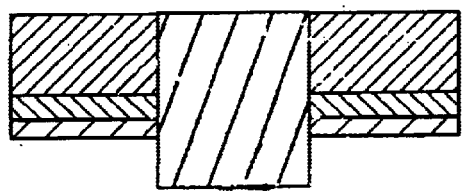

The cell portion is again masked by using photoresist 16. The resultant structure is shown in FIG. 2I. As for the periphery portion, the conventional process to form logic circuits, such as removal of the nitride layer 14, the masking and etching of the polysilicon layer 12 to form gates of logic devices can be made. The resultant structure is generally shown in FIG. 3I.

Figure 2J:
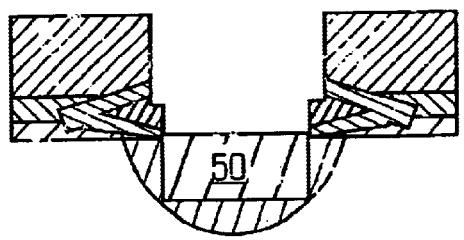
Figure 3J:
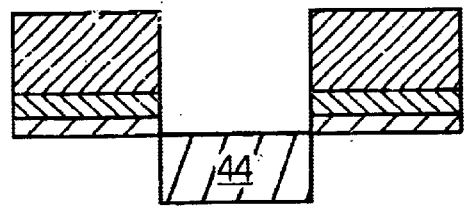

The photoresist 16 is then removed from the cell portion. The STI oxide 50 and STI 44 can be anisotropically etched to a height desired. As will be explained in greater detail later, the height of the STI 50 which is above the plane of the substrate 10 impacts the capacitive coupling of the operation of the device. The resultant structure is shown in FIGS. 2J and 3J.

Figure 2K:
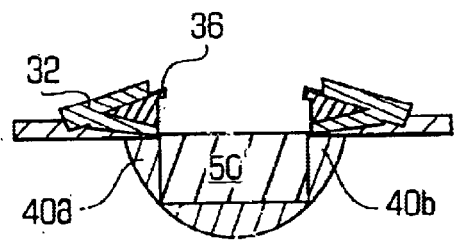
Figure 3K:
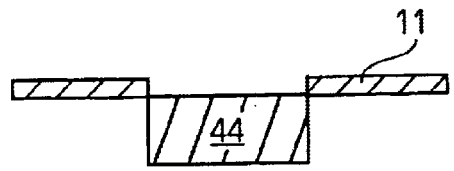

The layer of nitride 14 is then removed. The layer 12 of polysilicon is anisotropically removed by Reactive Ion Etching, using the oxide layer 11 as the etch stop. Because the polysilicon 36 that was deposited in a "cavity" as formed previously, is covered by a layer of oxide 32, the polysilicon 36, which is generally of a triangular shape, is not affected by the RIE polysilicon removal process. The polysilicon 36 will form the floating gate for the memory cell. The resultant structure is shown in FIGS. 2K and 3K.

Figure 2L:
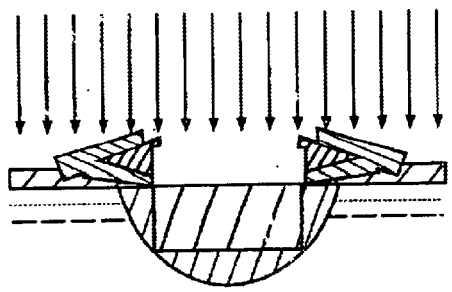
Figure 3L:
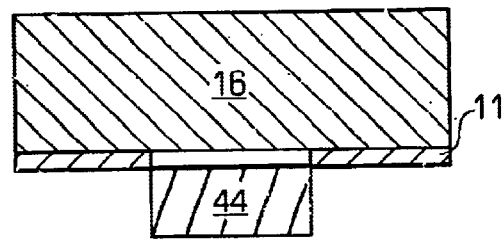

Photoresist 16 is then again applied covering the periphery portion of the device. The cell portion of the device is subject to an ion implantation step (which may include multiple ion implant steps), to adjust the Vth of the channel of the memory cell. The resultant structure is shown in FIGS. 2L and 3L.

Figure 2M:
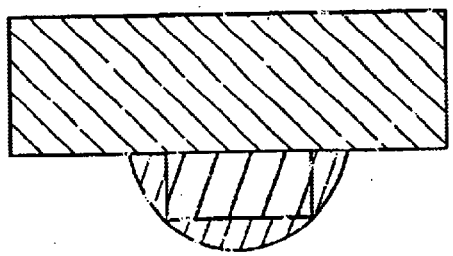
Figure 3M:
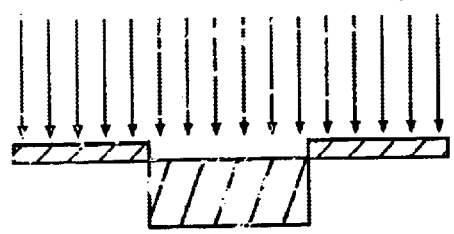

The photoresist 16 is then removed from the periphery portion, and then applied again to cover just the cell portion. The periphery portion of the device is subject to an ion implantation step (which may include multiple ion implant steps), to adjust the Vth of the channel of the periphery logic devices. The resultant structure is shown in FIGS. 2M and 3M.

The photoresist 16 is then removed. A wet oxide etch is then applied to remove the oxide layer 32 covering the floating gate 36. A high voltage gate dielectric is formed over the floating gate 36. This can be done by re-oxidizing the floating gate 36 and by applying a layer of HTO (High Temperature Oxide) 52 to the structure. The resultant structure is shown in FIGS. 2N and 3N.

Finally, a layer 54 of polysilicon is then applied, and doped and etched to form the control gate. The resultant structure is shown in FIGS. 2O and 3O.

Figure 4:
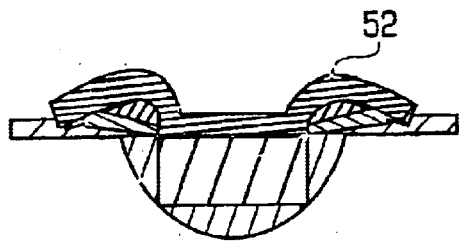
FIG. 4 is a cross sectional view of a memory cell of the present invention.
Figure 4:
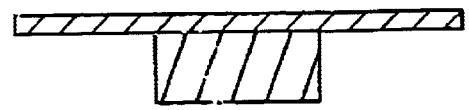
Figure 4:
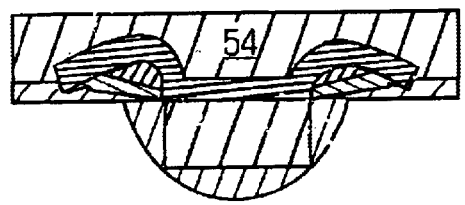
Figure 4:
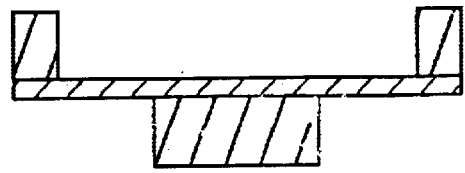
Figure 4:
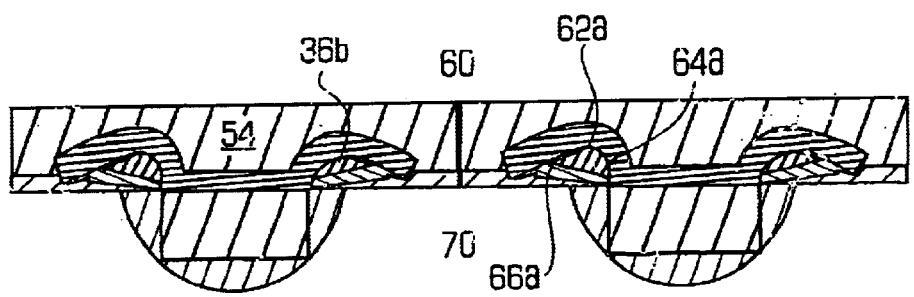

An example of a cross sectional view of a memory cell 60 of the present invention is shown in FIG. 4. As shown in FIG. 4, the cell 60 comprises a first and a second source/drain 40a and 40b, respectively each of, e.g. N type if the substrate 10 is of P type. A channel region 70 connects the first source/drain 40a to the second source/drain 40b. The channel region 70 has three portions: a first portion, immediately adjacent to the first source/drain 40a, a third portion, immediately adjacent to the second source/drain 40b, and a second portion between the first portion and the second portion. A first floating gate 36a is insulated from the channel region 70 and is "above" the first portion. A second floating gate 36b is insulated from the channel region 70 and is "above" the third portion. A control gate 54 is capacitively coupled to the first and second floating gates 36a and 36b and is insulated from the second portion of the channel region 70. The control gate generally runs in the Y or the column direction. Each of the floating gate 36a and 36b is formed in a cavity, and is generally triangularly shaped having "tips" 62, 64 and 66. As previously discussed, the floating gates 36 (a&b) can be made of a trapping material, such as nitride, in addition to polysilicon. Therefore, as used herein and in the claims, the term "floating gate" means any charge storage element, whether conducting or non-conducting, so long as the material can be formed in the "cavities" as discussed above.

As previously discussed, the "height" of the STI 50 controls the capacitive coupling between the control gate 54 and the floating gate 36. If the STI 50 were "taller" then the control gate 54 would be spaced further away from the floating gate 36 resulting in less capacitive coupling between them. If the STI 50 were at or near the planar level of the substrate 10, as shown in FIG. 4, then the capacitive coupling between the control gate 54 and the floating gate 36 is near a maximum.

Memory Cell Operation

The operation of the memory cell 60 shown in FIG. 4 will now be described.

Erase

The memory cell 60 is erased by applying 0 volts to the source/drain 40(a,b), and a high voltage, such as +12 volts to the control gate 54. Since the same voltage is applied to both source/drain regions 40(a,b), no charges will conduct in the channel region 70. Furthermore, because the control gate 54 is highly capacitively coupled to the floating gates 36(a,b), electrons from the floating gates 36(a,b) will be pulled by the positive voltage applied to the control gate 54, and through the mechanism of Fowler-Nordheim tunneling, the electrons are removed from the floating gates 54(a,b), and tunnel from the tips 62 through the tunneling oxide layer 52 onto the control gate 54. This mechanism of poly-to-poly tunneling for erase is set forth in U.S. Pat. No. 5,029,130, whose disclosure is incorporated herein in its entirety by reference.

It should be noted, however, that because the capacitive coupling between the control gate 54 and the floating gate 36 can be changed by the height of the STI 50, it is possible for the floating gates 36 to be highly capacitively coupled to the source/drain regions 40(a,b). In that event, to erase, a zero volt is applied to the control gate 54, and a high positive voltage such as +12 volts is applied to the source/drain 40(a,b). Electrons then tunnel from the tips 64 through the oxide layer 11, to the source/drain 40.

Programming

Programming of the memory cell 60 can occur in one of two mechanisms: either the first floating gate 36a is programmed or the second floating gate 36b is programmed. Let us first discuss the action of programming the first floating gate 36a, i.e. storage of electrons on the first floating gate 36a. The first source region 40a is held at a positive voltage of between 10 to 15 volts. The control gate 54 is held at a positive voltage of between 2 to 3 volts. The second source region 40b is held at 0 volts. Because the control gate 54 is strongly capacitively coupled to the second floating gate 40b, the positive voltage of 2–3 volts on the control gate 54 is sufficient to turn on the third portion of the channel region 70, i.e. the portion adjacent to the second source/drain region 40b, over which the second floating gate 36b lies, even if the second floating gate 36b is programmed, i.e. has electrons stored thereon. The positive voltage of 2–3 volts on the control gate 54 is sufficient to turn on the second portion of the channel region 70, i.e. the portion of the channel region 70 between the first portion and the third portion. The positive voltage of 10–15 volts on the first source region 40a is sufficient to attract the electrons in the channel region 70. Thus, electrons will traverse in the channel region 70 from the second source region 40b to the first source region 40a. However, at the junction in the channel region 70 where the channel region 70 is close to the tip 66a of the first floating gate 36a, the electrons will experience a sudden increase in voltage, caused by the positive high voltage of the first source region 40a, capacitively coupled to the first floating gate 36a. This causes the electrons to be hot channel injected onto the first floating gate 36a. This mechanism of hot channel electron injection for programming is set forth in U.S. Pat. No. 5,029,130, whose disclosure is incorporated herein in its entirety by reference.

To program the second floating gate 36b, the voltages applied to the first source region 40a are reversed from those applied to the second source region 40b.

Read

Reading of the memory cell 60 can occur in one of two mechanisms: either the state of the first floating gate 36a is read, or the state of the second floating gate 36b is read. Let us first discuss the action of reading the state of the second floating gate 36b, whether electrons are stored on the second floating gate 36b. The first source/drain region 40a is held at a positive voltage of between 2 to 3.5 volts. This is sufficient to create a depletion region that extends beyond the first portion of the channel region 70. The control gate 54 is held at a positive voltage of between 1 to 2 volts. The second source/drain region 40b is held at 0 volts. The positive voltage of 1–2 volts on the control gate 54 is sufficient to turn on the second portion of the channel region 70. Electrons will traverse in the channel region 70 from the second source/drain region 40b to the first source/drain region 40a, depending on whether the second floating gate 36b is programmed or not. If the second floating gate 36b is programmed, the third portion of the channel region 70 over which the second floating gate 36 lies will not be turned on. In that event no electron flow would occur. If, however, the second floating gate 36b is erased, then electrons will flow from the second source/drain region 40b, through the third portion of the channel region 70, through the second portion of the channel region 70 (because the control gate 54 has turned it on) and to the outer limit of the depletion region caused by the positive voltage applied to the first source/drain region 40a. Thus, the amount of current or the presence/absence of current sensed at the first source region 40a determines the state of programming of the second floating gate 36b.

To read the first floating gate 36a, the voltages applied to the first source/drain region 40a are reversed from those applied to the second source/drain region 40b.

Memory Cell Array operation

Figure 5:
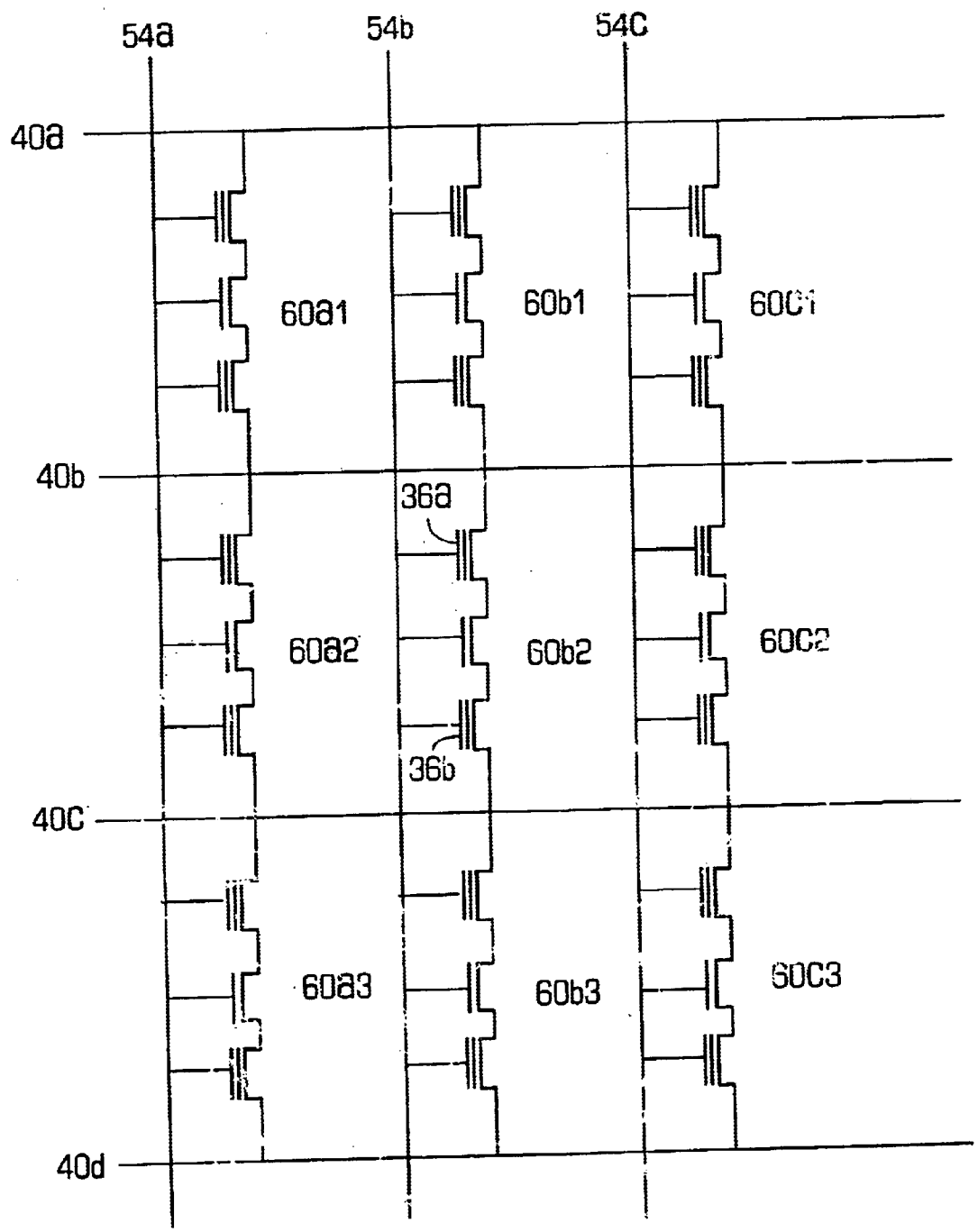
FIG. 5 is a schematic circuit diagram of the memory cell array of the present invention.

The operation of an array of memory cells 60 will now be described. Schematically, an array of memory cells is shown in FIG. 5. As shown in FIG. 5, an array of memory cells 60 comprises a plurality of memory cells 60 arranged in a plurality of columns: 60a(1–k), 60b(1–k), and 60c(1–k) and in rows: 60(a–n)1, 60(a–n)2 and 60(a–n)3. The control gate 54 connected to a memory cell 60 is also connected to other memory cells 60 in the same column. The first and second source/drain regions 40 connected to a memory cell 60 are also connected to other memory cells 60 in the same row.

Erase

In the erase operation, memory cells 60 in the same column connected by the common control gate line 54 are erased simultaneously. Thus, for example, if it is desired to erase memory cells 60 in the column 60b(1–n), the control gate line 54b is held at between 8 to 12 volts. The unselected control gate lines 54a and 54c are held at 0 volts. All the source/drain region lines 40a, 40b, and 40c are held at 0 volts. In this manner all of the memory cells 60b(1-n) are erased simultaneously, while no erase disturbance occurs with respect to the memory cells 60 in the other columns because all terminals to the memory cells 60 in all the other columns are at ground voltage.

Program

Let us assume that the second floating gate 36b of the memory cell 60b2 is to be programmed. Then based upon the foregoing discussion, the voltages applied to the various lines are as follows: control gate line 54b is at a positive voltage of between 2 to 3 volts. All the other unselected control gate lines 54 are held at 0 volts. Source/drain line 40b is held at 0 volts. All the unselected source/drain line 40 that are adjacent to the source/drain line 40b (on the side opposite source/drain 40b), such as source/drain line 40a, are held at 0 volts. Selected source/drain line 40c is held at a positive voltage of between 10 to 15 volts. All unselected source/drain lines 40 adjacent to the source/drain line 40b (on the side opposite source/drain 40a), such as source/drain line 40d, are held at a voltage of between 3 to 4 volts. The "disturbance" on the unselected memory cells 15 are as follows:

For the memory cells 60 in the unselected column, the application of 0 volts to control gate 54 means that none of the channel regions 70 for those memory cells 15c(1–n) and 15a(1–n) are turned on, because the second portion of the channel region (the portion to which the control gate 54 directly controls) are not turned on. Thus, there is no disturbance. For the memory cell 60b1 which is in the same selected column, but in an unselected row, the application of 0 volts to the source/drain lines 40a and 40b means that the channel region 70 is not turned on. For the memory cell 60b3 which is on the same selected column, but in an unselected row, the application of 3–4 volts to source/drain line 40d, which is greater than the voltage applied to the control gate 54b means that the channel region will not be turned on. Similarly for all other memory cells 60 in the selected column but unselected row, the channel region 70 of those memory cells 60 will not be turned on, due to the voltage to the source/drain lines to that memory cell 60 being at the same voltage.

To program the first floating gate 36a, the voltages applied to the source/drain lines 40b and 40c are reversed. In addition, the other unselected row lines will have the following voltages applied: for all the unselected source/drain lines on the same side as the source/drain line 40c, such as source/drain line 40d, 0 volts is applied; for all the unselected source/drain lines on the same side as the source/drain line 40b, such as source/drain line 40a, 3–4 volts is applied.

Read

Let us assume that the second floating gate 36b of the memory cell 60b2 is to be read. Then based upon the foregoing discussion, the voltages applied to the various lines are as follows: The source/drain line 40b is held at a positive voltage of between 2 to 3.5 volts. The control gate line 54b is held at a positive voltage between 1 to 2 volts. The source/drain line 40c is held at 0 volts.

The voltages applied to the unselected control gate lines 54 are at ground or 0 volts. The voltage on the unselected source/drain lines 40 to the same side as the source/drain line 40b, such as source/drain line 40a, is also at 2 to 3.5 volts. The voltage on the unselected source/drain lines 40 to the same side as a the source/drain line 40c, such as source/drain line 40d, is at 0 volts. The "disturbance" on the unselected memory cells 60 is as follows:

For the memory cells 60 in the unselected columns, the application of 0 volts to control gate lines 54 means that none of the channel regions 70 for those memory cells 60c(1–k) and 60a(1–k) is turned on. Thus, there is no disturbance. For the memory cell 60b3 which is in the same selected column, but in an unselected row, the application of 0 volts to line 40d, the same voltage as applied to source/drain 40c means that the channel region 70 of the memory cell 60b3 is not turned on. Thus, little or no disturbance to memory cell 60b3 would occur. Similarly, for the memory cells 60 in the same selected column but unselected rows to the other side of the source/drain 40b, there will not be any disturbance because the channel region 70 also will not be turned on, because the same voltage is applied to both of the source/drain lines 40 to each of the unselected memory cells 60, e.g. memory cell 60b1.

To read the first floating gate 36a, the voltages applied to the source/drain region line 40a are reversed from those applied to the source/drain region line 40b. In addition, the voltage applied to the source/drain region 40 of all the lines to the same side as the source/drain line 40b is reversed from that applied to the voltage applied to the same side as the source/drain lines 40c.

From the foregoing it can be seen that a novel, high density non-volatile memory cell, array and method of manufacturing is disclosed. It should be appreciated that although the preferred embodiment has been described in which a single bit is stored in each of the two floating gates in a memory cell, it is also within the spirit of the present invention to store multi-bits on each one of the floating gates in a single memory cell, thereby increasing further the density of storage.

What is claimed is:

1. A non-volatile memory cell comprising:
    a substantially single crystalline semiconductive material of a first conductivity type;
    a first region of a second conductivity type, different from said first conductivity type in said material;
    a second region of said second conductivity type in said material, spaced apart from said first region;
    a channel region, having a first portion, and a second portion, connecting said first and second regions for the conduction of charges;
    a dielectric on said channel region;
    a first floating gate on said dielectric, spaced apart from said first portion of said channel region; said first portion of said channel region adjacent to said first region, said first floating gate having generally a triangular shape; and
    a gate electrode capacitively coupled to said first floating gate, and spaced apart from said second portion of said channel region, said second portion of said channel region between said first portion and said second region.

2. The cell of claim 1 wherein said substantially single crystalline semiconductive material is single crystalline silicon.

3. The cell of claim 2 wherein said first floating gate was formed in a cavity.

4. The cell of claim 3, wherein said first floating gate is made of polysilicon.

5. The cell of claim 3, wherein said first floating gate is made of silicon nitride.

6. The cell of claim 3 wherein said channel region having a third portion, with said second portion adjacent to said second region, and said third portion between said first portion and said second portion; and wherein said cell further comprising:
    a second floating gate on said dielectric, spaced apart from said second portion of said channel region; said second floating gate having generally a triangular shape.

7. The cell of claim 6 wherein said second floating gate was formed in a cavity.

8. The cell of claim 7 further comprising a first trench having a sidewall and a bottom wall, and wherein said first region is along said sidewall and bottom wall of said first trench and is capacitively coupled to said first floating gate.

9. The cell of claim 8 further comprising a second trench having a sidewall and a bottom wall, and wherein said second region is along said sidewall and bottom wall of said second trench and is capacitively coupled to said second floating gate.

10. The cell of claim 9 wherein said second floating gate is made of polysilicon.

11. The cell of claim 9 wherein said second floating gate is made of silicon nitride.

12. A non-volatile memory cell for the storage of a plurality of bits, comprising:
    a substantially single crystalline semiconductive material of a first conductivity type;
    a first trench having a sidewall and a bottom wall in said material:
    a first region of a second conductivity type, different from said first conductivity type in said material, wherein said first region is along said side wall and said bottom wall of said first trench;

a second region of said second conductivity type in said material, spaced apart from said first region;

a channel region, having a first portion, a second portion and a third portion, connecting said first and second regions for the conduction of charges;

a dielectric on said channel region;

a first floating gate of polysilicon on said dielectric, spaced apart from said first portion of said channel region; said first portion of said channel region adjacent to said first region, said first floating gate for the storage of at least one of said plurality of bits;

wherein said first region is capacitively coupled to said first floating gate;

a second floating gate of polysilicon on said dielectric, spaced apart from said second portion of said channel region; said second portion of said channel region adjacent to said second region, said second floating gate for the storage of at least another of said plurality of bits; and a gate electrode capacitively coupled to said first floating gate and said second floating gate, and spaced apart from said third portion of said channel region, said third portion of said channel region between said first portion and said second portion.

13. The cell of claim 12 wherein said substantially single crystalline semiconductive material is single crystalline silicon.

14. The cell of claim 13 wherein said first floating gate is substantially of a triangular shape.

15. The cell of claim 14 wherein said second floating gate is substantially of a triangular shape.

16. The cell of claim 12 wherein said gate electrode is substantially parallel to said channel region.

17. The cell of claim 12 further comprising a second trench having a sidewall and a bottom wall, and wherein said second region is along said sidewall and bottom wall of said second trench and is capacitively coupled to said second floating gate.

18. An array of non-volatile memory cells, arranged in a plurality of rows and columns, said array comprising:

a substantially single crystalline semiconductive substrate material of a first conductivity type;

a plurality of non-volatile memory cells arranged in a plurality of rows and columns in said semiconductive substrate material with each cell for storing a plurality of bits, and with each cell comprising:

a first region of a second conductivity type, different from said first conductivity type in said material;

a second region of said second conductivity type in said material, spaced apart from said first region;

a channel region, having a first portion, a second portion and a third portion, connecting said first and second regions for the conduction of charges;

a dielectric on said channel region;

a first floating gate of polysilicon on said dielectric, spaced apart from said first portion of said channel region; said first portion of said channel region adjacent to said first region, said first floating gate for the storage of at least one of said plurality of bits;

a second floating gate of polysilicon on said dielectric, spaced apart from said second portion of said channel region; said second portion of said channel region adjacent to said second region, said second floating gate for the storage of at least another of said plurality of bits; and a gate electrode capacitively coupled to said first floating gate and said second floating gate, and spaced apart from said third portion of said channel region, said third portion of said channel region between said first portion and said second portion, wherein said cells in the same row have said gate electrode in common;

wherein said cells in the same column have said first region in common and said second region in common; and wherein said cells in adjacent columns have said first region in common.

19. The array of claim 18 wherein said substantially single crystalline semiconductive material is single crystalline silicon.

20. The array of claim 19 wherein said first floating gate is generally triangularly shaped.

21. The array of claim 20 wherein said second floating gate is generally triangularly shaped.

22. The array of claim 21 wherein said gate electrode is substantially parallel to said channel region.

23. The array of claim 22 further comprising a first trench having a sidewall and a bottom wall, and wherein said first region is along said sidewall and bottom wall of said first trench and is capacitively coupled to said first floating gate.

24. The array of claim 23 further comprising a second trench having a sidewall and a bottom wall, and wherein said second region is along said sidewall and bottom wall of said second trench and is capacitively coupled to said second floating gate.

* * * * *